(12) United States Patent
Waldock et al.

(10) Patent No.: US 10,409,927 B2
(45) Date of Patent: Sep. 10, 2019

(54) SYSTEM DESIGN

(71) Applicant: BAE SYSTEMS plc, London (GB)

(72) Inventors: Antony James Waldock, Bristol (GB); David Wolfe Corne, Edinburgh Lothian (GB); David Anthony Edward Morgan, Filton (GB)

(73) Assignee: BAE SYSTEMS plc, London (GB)

( * ) Notice: Subject to any disclaimer, the term of this patent is extended or adjusted under 35 U.S.C. 154(b) by 1129 days.

(21) Appl. No.: 14/414,016

(22) PCT Filed: Jul. 4, 2013

(86) PCT No.: PCT/GB2013/051780
§ 371 (c)(1),
(2) Date: Jan. 9, 2015

(87) PCT Pub. No.: WO2014/009699
PCT Pub. Date: Jan. 16, 2014

(65) Prior Publication Data
US 2015/0205891 A1 Jul. 23, 2015

(30) Foreign Application Priority Data
Jul. 11, 2012 (GB) .................................. 1212311.3

(51) Int. Cl.
G06F 17/50 (2006.01)
G06F 8/30 (2018.01)

(52) U.S. Cl.
CPC .......... *G06F 17/5009* (2013.01); *G06F 8/311* (2013.01)

(58) Field of Classification Search
CPC .............................. G06F 17/5009; G06F 8/311
See application file for complete search history.

(56) References Cited

U.S. PATENT DOCUMENTS 5,949,989 A    9/1999  Falkowski et al.
2010/0057410 A1  3/2010  Yanami et al.

FOREIGN PATENT DOCUMENTS

WO        02103581 A2    12/2002
WO       2014009699 A1    1/2014

OTHER PUBLICATIONS

Chris Paredis, "Model-Based Systems Engineering with SysML: Problem definition, simulation and optimization," 2011, Georgia Tech, 51 pages.*

(Continued)

Primary Examiner — Kamini S Shah
Assistant Examiner — Russ Guill
(74) Attorney, Agent, or Firm — Finch & Maloney PLLC

(57) ABSTRACT

A method and apparatus for producing a design for a system (2) that comprises a plurality of subsystems (4, 6) is provided. Criteria to be satisfied by the system (2) are identified. For each subsystem (4, 6), further criteria that are to be satisfied by that subsystem (4, 6) are determined and a parametric model (8, 16) is then determined. These comprise inputs (10, 18) and outputs (14, 22) that are dependent on the inputs (10, 18). A systems engineering model (100) comprising, as inputs, parametric model inputs (10, 18) is then determined. System model outputs (28) are dependent on the system model inputs. Groups consisting of some of the system model inputs are formed and an optimization process is performed, for each group, to determine inputs that optimize the system model outputs (28). A set of inputs that optimize the system model outputs (28) provides a design for the system.

15 Claims, 3 Drawing Sheets

(56) References Cited

OTHER PUBLICATIONS

Byung I. Min et al., "Process integration and design optimization for model-based systems engineering with SysML," 2011, Proceedings of the ASME 2011 International Design Engineering Technical Conferences, pp. 1-9.*

Qingfu Zhang et al., "MOEA/D: A multiobjective evolutionary algorithm based on decomposition," 2007, IEEE Transactions on Evolutionary Computation, vol. 11, No. 6, pp. 712-730.*

Mitchell A. Potter et al., "Cooperative coevolution: an architecture for evolving coadapted subcomponents," 2000, Evolutionary Computation, vol. 8, No. 1, pp. 1-29.*

Gregory A. Hubbard et al., "Modeling and simulation of a hybrid-electric vehicle drivetrain," 1997, Proceedings of the American Control Conference, pp. 636-640.*

Michael A. Potter et al., "A cooperative coevolutionary approach to function optimization," 1994, In: Davidor Y., Schwefel HP., Männer R. (eds) Parallel Problem Solving from Nature—PPSN III. PPSN 1994, Lecture Notes in Computer Science, vol. 866, Springer, pp. 249-257.*

James C. Spall, "Cyclic seesaw optimization and identification," Dec. 12, 2011, 50th IEEE Conference on Decision and Control and European Control Conference, pp. 4441-4447.*

Holmes E. Miller et al., "Nurse scheduling using mathematical programming," 1976, Operations Research, vol. 24, No. 5, pp. 857-870.*

Anas Alfaris, "Multidisciplinary system design optimization (MSDO)," 2010, Massachusetts Institute of Technology, 40 pages.*

Panos Y. Papalambros et al. "Trends and challenges in system design optimization," 2000, Proceedings of the International Workshop on Multidisciplinary Design Optimization, Pretoria, S. Africa, Aug. 7-10, 2000, 15 pages (Year: 2000).*

International Search Report received for Patent Application No. PCT/GB2013/051780, dated Nov. 13, 2013. 3 pages.

GB Intellectual Property Office Search Report under Section 17(5) received for GB Patent Application No. 1212311.3 dated Nov. 1, 2012. 3 pages.

Allison, James, et al., "On the Use of Analytical Target Cascading and Collaborative Optimization for Complex System Design," 6th World Congress on Structural and Multidisciplinary Optimization, May 30, 2005. pp. 1-10.

OMG: "OMG Systems Modeling Language V1.0—OMG Available Specification," OMG available specifications, Sep. 1, 2007. pp. 1-255.

International Preliminary Report on Patentability and Written Opinion received for Patent Application No. PCT/GB2013/051780, dated Jan. 22, 2015. 11 pages.

* cited by examiner

SYSTEM DESIGN

FIELD OF THE INVENTION

The present invention relates to the production of system designs.

BACKGROUND

In the field of systems design and engineering, when designing a large scale complex system (e.g. an autonomous vehicle), a problem of balancing design objectives (e.g. a maximum weight for the vehicle, a minimum top-speed for the vehicle, etc.) across the whole system tends to be a time consuming and error prone process.

Conventionally, the large scale complex system is divided into smaller subsystems or components. These subsystems may then be designed individually against derived requirements. With this "divide and conquer" approach, a single design choice for one subsystem could move the entire design (i.e. the design of the system as a whole) to a limiting area of the design space. This tends to be the case when designing autonomous systems where individual components can be controlled or reconfigured at design time or during the lifetime of the system.

SUMMARY OF THE INVENTION

In a first aspect, the present invention provides a method of producing a design for a system, the system comprising a plurality of subsystems, the method comprising identifying one or more criteria that are to be satisfied by the system; for each subsystem, using the one or more identified criteria, determining one or more further criteria that are to be satisfied by that subsystem; for each subsystem, using the one or more further criteria determined for that subsystem, determining a parametric model for that subsystem, the parametric model for that subsystem comprising one or more parametric model inputs and one or more parametric model outputs, each of the parametric model inputs relating to an attribute of that subsystem, each of the parametric model outputs being dependent upon one or more of the parametric model inputs for that parametric model, each of the parametric model outputs relating to one or more of the further criteria determined for that subsystem; using the determined parametric models, determining a systems engineering model for the system, the systems engineering model for the system comprising one or more system model inputs and one or more system model outputs, each system model input being a parametric model input for one or more of the determined parametric models, each of the system model outputs being dependent upon one or more of the system model inputs, each of the system model outputs relating to one or more of the identified criteria, forming one or more groups, each group consisting of a number of system model inputs that is less than the total number of system model inputs; performing, for each group of system model inputs, using the systems engineering model, by one or more processors, an optimisation process to determine a set of system model inputs that correspond to the identified criteria being satisfied, the optimisation process for a group of system model inputs comprising: fixing or constraining the values of the system model inputs that are not in that group, and determining values for the system model inputs within that group such that the criteria are satisfied; and selecting one of the one or more sets of system model inputs that correspond to the identified criteria being satisfied, whereby to provide a design for the system.

The method may further comprise constructing a system in accordance with the produced design.

The step of forming one or more groups may comprise: providing a representation of the systems engineering model using the Systems Modelling Language (SysML™); displaying to a human operator, on a display operatively coupled to the one or more processors, the SysML representation of the systems engineering model; analysing, by the human operator, the displayed SysML representation of the systems engineering model to determine the one or more groups, and specifying, by the human operator to the one or more processors, the determined groups.

The step of determining a systems engineering model for the system may comprise specifying the systems engineering model using the SysML modelling language.

The step of forming one or more groups may comprise specifying, by a human operator, the one or more groups.

The step of forming one or more groups may be performed by the one or more processors.

The step of optimising may comprise performing a cooperative coevolution process.

The step of selecting one of the one or more sets of systems model inputs may comprise: using the determined one or more sets of system model inputs that correspond to the identified criteria being satisfied, determining a Pareto optimal set of sets of system model inputs that correspond to the identified criteria being satisfied, and selecting a member of the Pareto optimal set, whereby to provide a design for the system.

The system may be an autonomous system.

The system may be a vehicle.

In a further aspect, the present invention provides apparatus for producing a design for a system, the system comprising a plurality of subsystems, the apparatus comprising: means for identifying one or more criteria that are to be satisfied by the system; means, for each subsystem and, using the one or more identified criteria, for determining one or more further criteria that are to be satisfied by that subsystem; means, for each subsystem, using the one or more further criteria determined for that subsystem, for determining a parametric model for that subsystem, the parametric model for that subsystem comprising one or more parametric model inputs and one or more parametric model outputs, each of the parametric model inputs relating to an attribute of that subsystem, each of the parametric model outputs being dependent upon one or more of the parametric model inputs for that parametric model, each of the parametric model outputs relating to one or more of the further criteria determined for that subsystem; means, using the determined parametric models, for determining a systems engineering model for the system, the systems engineering model for the system comprising one or more system model inputs and one or more system model outputs, each system model input being a parametric model input for one or more of the determined parametric models, each of the system model outputs being dependent upon one or more of the system model inputs, each of the system model outputs relating to one or more of the identified criteria; means for forming one or more groups, each group consisting of a number of system model inputs that is less than the total number of system model inputs; one or more processors configured to perform, for each group of system model inputs, using the systems engineering model, an optimisation process to determining a set of system model inputs that correspond to the identified criteria being satisfied, the optimisation process for a group of system model inputs comprising: fixing or constraining the values of the system model inputs that are not in that group, and determining values for the system model inputs within that group such that the criteria are satisfied, and means for selecting one of the one or more sets of systems model inputs that correspond to the identified criteria being satisfied, whereby to provide a design for the system.

The means for forming one or more groups may comprise: one or more processors configured to provide a representation of the systems engineering model using the SysML modelling language; a display operatively coupled to the one or more processors and configured to display, to a human operator, the SysML representation of the systems engineering model such that the human operator may analyse the displayed SysML representation of the systems engineering model to determine the one or more groups, and a user input operatively coupled to the one or more processors and configured to input to the one or more processors a specification of the determined groups.

The means for selecting one of the one or more sets of systems model inputs may comprise: one or more processors configured, using the determined one or more sets of system model inputs that correspond to the identified criteria being satisfied, to determine a Pareto optimal set of sets of system model inputs that correspond to the identified criteria being satisfied, and means for selecting a member of the Pareto optimal set, whereby to provide a design for the system.

In a further aspect, the present invention provides a system constructed in accordance with the method of any of the above aspects.

In a further aspect, the present invention provides a computer program or plurality of computer programs arranged such that when executed by a computer system it/they cause the computer system to operate in accordance with the method of any of the above aspects.

In a further aspect, the present invention provides a machine readable storage medium storing a computer program or at least one of the plurality of computer programs according to the previous aspect.

DETAILED DESCRIPTION

Figure 1:
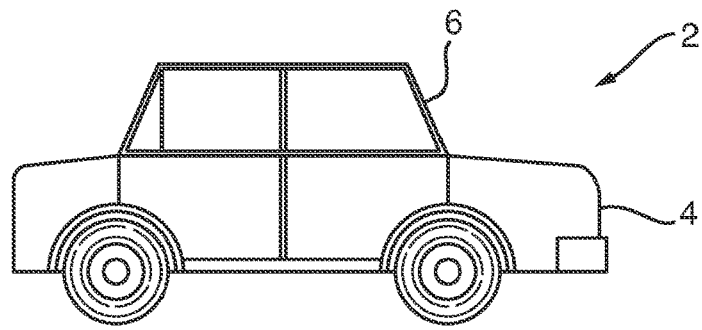
FIG. 1 is a schematic illustration (not to scale) of a vehicle.

FIG. 1 is a schematic illustration (not to scale) of a vehicle 2. The vehicle 2 is an example system that is to be designed and built using an embodiment of a method of designing and producing a system. The method of designing and building a producing is described in more detail later below with reference to FIG. 2.

The vehicle 2 is a land-based autonomous vehicle. The vehicle 2 comprises a plurality of subsystems, in particular a chassis 4 (which includes a plurality of wheels using which the vehicle 2 may move over the ground) and a battery 6 (for powering the vehicle 2 to move).

The vehicle 2 is to be designed and produced such that it fulfils one or more criteria as described in more detail later below with reference to FIG. 2. The design and production of the vehicle 2 comprises designing and producing each of the vehicle subsystems (i.e. the chassis 4 and the battery 6) as described in more detail later below with reference to FIG. 2.

In other examples, the vehicle 2 may comprise further vehicle subsystems in addition to or instead of the chassis 4 and the battery 6. Design and/or production of the vehicle 2 may comprise design and/or production of these further vehicle subsystems.

Apparatus for performing the method steps to be described later below with reference to FIG. 2, may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine readable storage medium such as computer memory, a computer disk, ROM, PROM etc., or any combination of these or other storage media.

It should be noted that certain of the process steps depicted in the flowchart of FIG. 2 and described below may be omitted or such process steps may be performed in differing order to that presented above and shown in FIG. 2. Furthermore, although all the process steps have, for convenience and ease of understanding, been depicted as discrete temporally-sequential steps, nevertheless some of the process steps may in fact be performed simultaneously or at least overlapping to some extent temporally.

Figure 2:
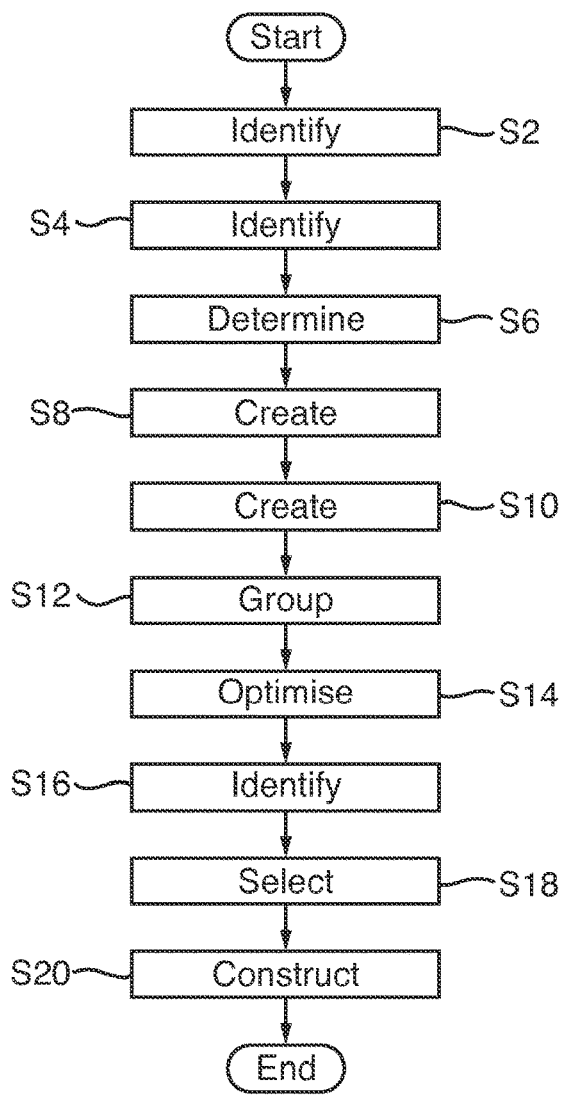
FIG. 2 is a process flow chart showing certain steps of a process of designing and producing the vehicle.

FIG. 2 is a process flow chart showing certain steps of a process of designing and producing the vehicle 2.

The terminology "identify" is used herein to refer to any appropriate form of identifying, selecting, choosing, establishing, acquiring etc.

At step s2, the subsystems (or components) of the vehicle 2 that are to be designed and produced are identified. In this embodiment, the chassis 4 and the battery 6 are identified as vehicle subsystems that are to be designed and produced.

At step s4, the criteria that are to be met by the designed and produced vehicle 2 are identified. These criteria may be any appropriate criteria that it is desired or required that the produced vehicle 2 satisfies. These criteria that are to be met by the designed and produced vehicle 2 may be thought of as "system requirements".

In this embodiment, the criteria that are to be met by the designed and produced vehicle 2 are (i) that the vehicle 2 weighs less than or equal to 2 kg; and (ii) that the maximum speed of the vehicle 2 is at least 3 kmph. However, in other embodiments, there may be one or more different criteria instead of or in addition to those criteria.

At step s6, using the identified criteria that are to be met by the designed and produced vehicle 2, for each of the vehicle subsystems (or components) that are to be designed and produced (i.e. for each of the vehicle subsystems identified at step s2), a set of one or more further criteria are determined.

The criteria determined for the vehicle subsystems (i.e. the chassis 4 and the battery 6) may depend on the vehicle 2 being designed and possible properties or attributes that a vehicle subsystem may have. For example, if it is known that a minimum weight for a vehicle chassis is 1 kg, and the vehicle must satisfy the criterion that the vehicle 2 weighs less than or equal to 2 kg, then a criterion for the battery 6 is that the battery 6 weighs less than 1 kg. Similarly, if it is known that a battery below size "X" could never yield a maximum speed for the vehicle 2 of more than 3 kmph, but the vehicle must satisfy the criterion that the maximum speed of the vehicle 2 is at least 3 kmph, then a criterion for the battery 6 is that the battery 6 is greater than size "X".

At step s8, for each of the vehicle subsystems (or components) that are to be designed and produced (i.e. for each of the vehicle subsystems identified at step s2), a parametric model is produced. The parametric models may be produced using the criteria determined for the vehicle subsystems at step s4. Thus, in this embodiment, a parametric model for each of the chassis 4 and the battery 6 are created.

The parametric models may, for example, be created or specified by one or more human designers, by one or more processors, or in any other appropriate way. For example, the parametric models may be retrieved from a parametric model repository e.g. by one or more processors.

Steps s10 to s20 of the process of FIG. 2 will be described in more detail later below after a description of example parametric models for the chassis 4 and the battery 6.

Figure 3:
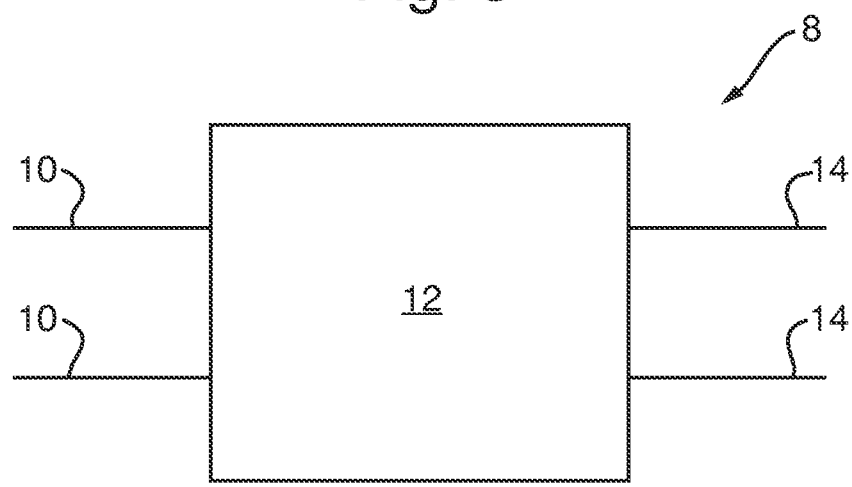
FIG. 3 is a schematic illustration (not to scale) of an example of a first parametric model.

FIG. 3 is a schematic illustration (not to scale) of an example of a first parametric model 8.

The first parametric model 8 is a parametric model for the chassis 4.

The first parametric model 8 comprises a plurality of inputs (hereinafter referred to as the "first inputs" and indicated in FIG. 3 by the reference numeral 10), a set of functions (hereinafter referred to as the "first functions" and represented in FIG. 3 by a box and indicated by the reference numeral 12), and a plurality of outputs (hereinafter referred to as the "first outputs" and indicated in FIG. 3 by the reference numeral 14).

In this embodiment, the first inputs 10 for the first parametric model 8 may be any appropriate property or attribute for the chassis 4. In this embodiment, the first parametric model 8 comprises two first inputs 10. The first inputs 10 are "chassis type" and "chassis size".

In this embodiment, the first functions 12 is a set of one or more functions. Each of the first functions 12 is a function of one or more of the first inputs 10. In this embodiment, each of the first functions 12 is either a function that specifies one or more criteria that must be satisfied by the chassis 4, or is a function for determining an attribute of the chassis 4 depending on one or more of the first inputs 10.

In this embodiment, the first functions 12 comprise a function for determining the weight of the chassis 4 from the first inputs and a function for determining the capacity (or maximum load) that the chassis 4 would be able to carry depending on the first inputs 10, i.e. the first functions 12 include the following functions:

$$w_c = f_1(i_{1,1}, i_{1,2})$$

$$c_c = f_2(i_{1,1}, i_{1,2})$$

where:
$w_c$ is the weight of the chassis 4;
$i_{1,1}$ is a value of a first of the first inputs 10 (i.e. a value for the "chassis type" parameter);
$i_{1,2}$ is a value of a second of the first inputs 10 (i.e. a value for the "chassis size" parameter);
$c_c$ is the capacity of the chassis 4; and
$f_1$ and $f_2$ are some functions.

Furthermore, the first functions may specify the criteria determined for the chassis 4 at step s6. For example, if it is known that a minimum weight for a vehicle chassis is 1 kg, the first functions 12 may include the function $w_c \geq 1$ kg.

In this embodiment, the first outputs 14 may be values of one or more of the first functions 12 when values for the first inputs 10 are specified. The values of the first outputs 14 may be produced depending on whether or not the criteria specified at step s6 are satisfied (e.g. if the first inputs 10 do not satisfy one or more of the criteria specified for the chassis at step s6, the first outputs 14 may not be determined).

In this embodiment, the first outputs 14 are values for the weight of the chassis, $w_c$, and the capacity of the chassis $c_c$. For example, if the first inputs 10 are specified as "chassis type=A" and "chassis size=B", the first outputs 14 may be, for example, the values $f_1(A,B)$ and $f_2(A, B)$ for the weight of the chassis, $w_c$, and the capacity of the chassis $c_c$ respectively. Values for the outputs 14 may, for example, only be produced if the criteria specified in the first functions 12 (e.g. that $w_c \geq 1$ kg) are satisfied.

Figure 4:
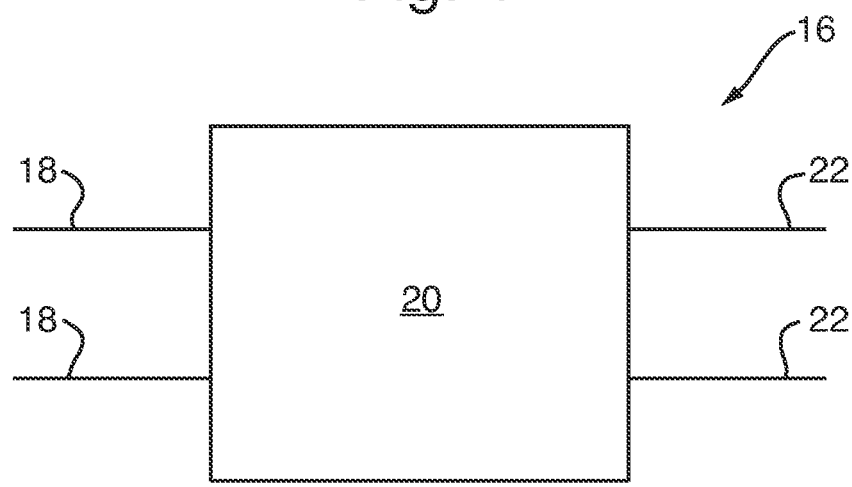
FIG. 4 is a schematic illustration (not to scale) of an example of a second parametric model.

FIG. 4 is a schematic illustration (not to scale) of an example of a second parametric model 16.

The second parametric model 16 is a parametric model for the battery 6.

The second parametric model 16 comprises a plurality of inputs (hereinafter referred to as the "second inputs" and indicated in FIG. 4 by the reference numeral 18), a set of functions (hereinafter referred to as the "second functions" and represented in FIG. 4 by a box and indicated by the reference numeral 20), and a plurality of outputs (hereinafter referred to as the "second outputs" and indicated in FIG. 4 by the reference numeral 22).

In this embodiment, the second inputs 18 for the second parametric model 16 may be any appropriate property or attribute for the battery. In this embodiment, the second parametric model 16 comprises two second inputs 18. The second inputs 18 are "battery type" and "battery size".

In this embodiment, the second functions 20 is a set of one or more functions. Each of the second functions 20 is a function of one or more of the second inputs 18. In this embodiment, each of the second functions 20 is either a function that specifies one or more criteria that must be satisfied by the battery 6, or is a function for determining an attribute of the battery 6 depending on one or more of the second inputs 18.

In this embodiment, the second functions 20 comprise a function for determining the weight of the battery 6 from the second inputs 18, and a function for determining the power that the battery 6 would provide, i.e. the first functions 12 include the following functions:

$$w_b = g_1(i_{2,1}, i_{2,2})$$

$$p_b = g_2(i_{2,1}, i_{2,2})$$

where:
$w_b$ is the weight of the battery 6;
$i_{2,1}$ is a value of a first of the second inputs 18 (i.e. a value for the "battery type" parameter);
$i_{2,2}$ is a value of a second of the second inputs 18 (i.e. a value for the "battery size" parameter);
$p_b$ is the power supplied by the battery 6; and
$g_1$ and $g_2$ are some functions.

Furthermore, the second functions 20 may specify the criteria determined for the battery 6 at step s6. For example, if it is known that a maximum weight for a vehicle battery 6 is 1 kg, the second functions 20 may include the function $w_b \leq 1$ kg. Similarly, if it is known that a minimum size for the battery 6 is X, the second functions 20 may include the function $i_{2,2} \geq X$.

In this embodiment, the second outputs 22 may be values of one or more of the second functions 20 when values for the second inputs 18 are specified. The values of the second outputs 18 may be produced depending on whether or not the criteria specified at step s6 are satisfied (e.g. if the second inputs 18 do not satisfy one or more of the criteria specified for the battery 6 at step s6, the second outputs 22 may not be determined).

In this embodiment, the second outputs 22 are values for the weight of the battery, $w_b$, and the output power of the battery, $p_b$. For example, if the second inputs 18 are specified as "battery type=C" and "battery size=D", the second outputs 22 may be, for example, the values $g_1(C, D)$ and $g_2(C, D)$ for the weight of the battery, $w_b$, and the output power of the battery, $p_b$, respectively. Values for the second outputs 22 may, for example, only be produced if the criteria specified in the second functions 10 (e.g. that $w_b \leq 1$ kg and $i_{2,2} \geq X$) are satisfied.

Returning now to the process of FIG. 2, at step s10, using the parametric models of the vehicle subsystems (i.e. the first and second parametric models 8, 16), a systems engineering model is produced.

The systems engineering model may connect together the parametric models of the vehicle subsystems 8, 16 such that relationships between any of the input values, output values, functions, or criteria of different parametric models are represented or expressed (i.e. are modelled). Furthermore, the system requirements, i.e. the criteria that (in this embodiment) are to be satisfied by the vehicle 2, may also be represented in the system engineering model.

The systems engineering model may be determined or constructed in any appropriate way. For example, the systems engineering model may be created or specified by one or more human designers, by one or more processors. Also, the systems engineering model may represented or expressed in any appropriate format e.g. using any appropriate software tool. Preferably, the systems engineering model is expressed or produced using a general-purpose modelling language for systems engineering applications. More preferably, the systems engineering model is expressed or produced using the Systems Modeling Language (SysML™).

Steps s12 to s20 of the process of FIG. 2 will be described in more detail later below after a description of an example systems engineering model.

Figure 5:
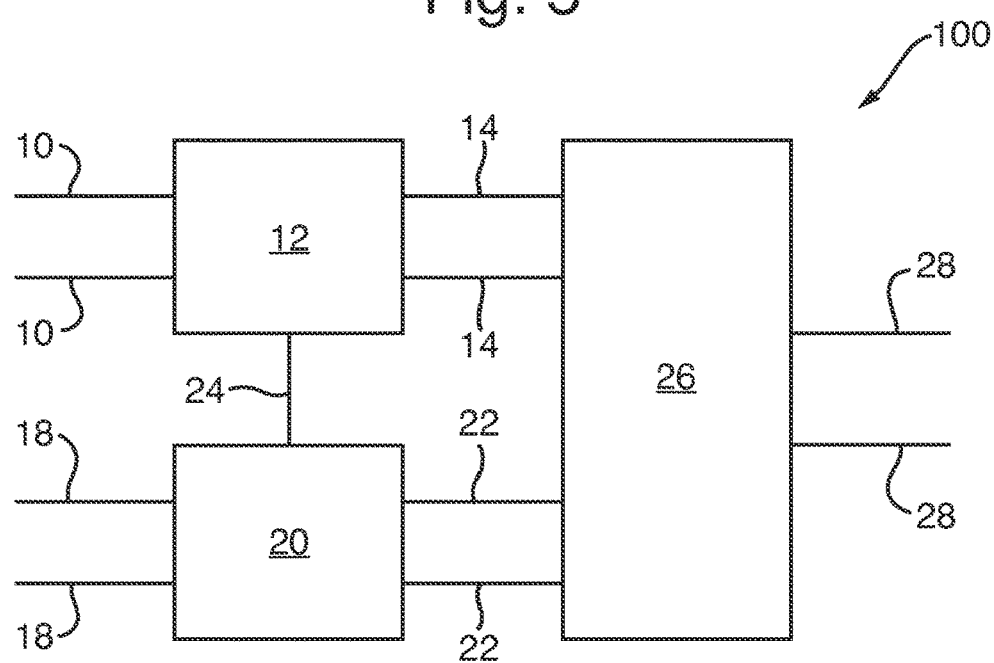
FIG. 5 is a schematic illustration (not to scale) of an example systems engineering model.

FIG. 5 is a schematic illustration (not to scale) of an example systems engineering model 100.

In this embodiment, the systems engineering model 100 comprises the first and second parametric models 8, 16. The first and second parametric models 8, 16 may be connected (e.g. as indicated in FIG. 5 by the link 24). The connection between the first and second parametric models 8, 16 (as represented by the link 24) may express relationships between the subsystem requirements for the chassis 4 and the battery 6 (i.e. between inputs, outputs, functions and criteria relating to the chassis 4 and those relating to the battery 6). For example, the connection between the first and second parametric models 8, 16 may express that the capacity of the chassis 4 is to be greater than or equal to the size of the battery 6 (i.e. a requirement that the chassis can accommodate the battery 6). This relationship may, for example, be represented by the formula $c_c \geq i_{2,2}$, which may be included in the first set of functions 12. Similarly, the connection 24 may express that the size of the battery 6 is to be less than or equal to the capacity of the chassis 4 (i.e. the equivalent requirement that the battery 6 can be accommodated by the chassis 4). This relationship may, for example, be represented by the formula $i_{2,2} \leq c_c$, which may be included in the second set of functions 20.

In this embodiment, the inputs of the first and second parametric models 8, 16 (i.e. the first inputs 10 and the second inputs 18) form the inputs to the systems engineering model 100. In other embodiments, further inputs (instead of or in addition to the parametric model inputs) for the systems engineering model 100 may be specified. These additional inputs may be inputs for one or more of the parametric models for the vehicle subsystems. In other embodiments, the parametric models for the vehicle subsystems may share inputs.

In this embodiment, the systems engineering model 100 further comprises a further set of functions, hereinafter referred to as the "third functions" and indicated in FIG. 5 by the reference numeral 26.

In this embodiment, the third functions 26 are a set of one or more functions. Each of the third functions 26 may be a function of one or more of the outputs 14, 22 of the vehicle subsystem parametric models 8, 16. In this embodiment, each of the third functions 26 is either a function that specifies one or more criteria that must be satisfied by the vehicle 2 (i.e. the system as a whole), or is a function for determining an attribute of the vehicle 2 that depends on one or more of the outputs of the vehicle subsystem parametric models 8, 16 (which in turn depend upon inputs to those vehicle subsystem parametric models 8, 16, i.e. which depend upon specified attributes of the vehicle subsystems).

In this embodiment, the third functions 26 comprise functions relating to the system requirements. For example, the third functions 26 comprise a function for determining the total weight of the vehicle 2 and a function for determining the maximum speed of the vehicle 2. For example, the third functions 26 include the following functions:

$$w_v = h_1(w_c, w_b) = w_c + w_b$$

$$v_v = h_2(w_v, p_b)$$

where:
  $w_v$ is the total weight of the vehicle 2;
  $v_v$ is the maximum speed of the vehicle 2; and
  $h_1$ and $h_2$ are some functions.

Furthermore, the third functions 26 may specify the criteria identified for the vehicle 2 at step s4 (i.e. the system requirements). For example, the criterion that the vehicle 2 weighs less than or equal to 2 kg may be expressed by the function $w_v \leq 2$ kg. Similarly, the criterion that the maximum speed of the vehicle 2 is at least 3 kmph may be expressed by the function $v_v \geq 3$ kmph.

The outputs of the third functions 26 (hereinafter referred to as the "third outputs" and indicated in FIG. 5 by the reference numerals 28) may be values of one or more of the third functions. The values of the third outputs 28 may be produced depending on whether or not the criteria specified at step s4 (i.e. the system requirements) are satisfied. For example, if one or more of the criteria specified in the third functions 26 (e.g. if either or both of $w_v \leq 2$ kg and $v_v \geq 3$ kmph are not satisfied) the third outputs 28 may not be determined. Alternatively, in other embodiments, the third outputs 28 may be determined despite one or more of the criteria specified in the third functions 26 not being met. The vehicle design corresponding to the third outputs 28 that do not satisfy one or more of the criteria may be flagged as an "invalid design".

In this embodiment, the second outputs 22 are values for the weight of the vehicle, $w_v$, and the maximum speed of the vehicle, $v_v$. Values for the third outputs 28 may, for example, only be produced if the criteria specified in the third functions 26 (e.g. that $w_v \leq 2$ kg and $v_v \geq 3$ kmph) are satisfied.

Returning now to the process of FIG. 2, steps s12 to s20 will be described. Steps s12 to s14 are performed, in effect, to determine input parameters 10, 18 that optimise (e.g. maximise) the third outputs 28.

At step s12, the inputs to the systems engineering model 100 (i.e. the first inputs 10 and the second inputs 18) are grouped into one or more groups. The groups of inputs to the systems engineering model 100 are hereinafter referred to as "input groups". In this embodiment, the size of each of the input groups is smaller than the total number of inputs. However, in other embodiments, an input group, the size of which is equal to the number of inputs, may be used. Further information about the grouping of the inputs to the systems engineering model 100 is provided below. The grouping of the inputs to the systems engineering model 100 may be performed by a human systems designer, or (automatically) by one or more processors.

At step s14, for each input group, an optimisation process is performed over the systems engineering model 100. Optimisation processes may be performed, for example, by one or more processors or other such apparatus.

In this embodiment, an optimisation process for an input group is a process in which values for inputs not in that input group (i.e. the other inputs to the systems engineering model 100) are fixed, and values of the inputs in that input group that "optimise" the outputs of the systems engineering model 100 are determined. In this embodiment, any appropriate optimisation algorithm may be performed to determine the values of the inputs in the input group that optimise the outputs of the systems engineering model 100.

Steps s12 and s14, in effect, partition the problem of finding a substantially optimal set of inputs for the systems engineering model 100 into a plurality of sub-problems. In other words, steps s12 and s14 describe a problem decomposition approach to the problem of finding a substantially optimal set of inputs for the systems engineering model 100, that involves breaking the larger problem down into a plurality of smaller sub-problems.

In some embodiments, the larger problem may be fully decomposable, i.e. there may be no interaction or interdependency between the sub-problems. In this case, problem decomposition tends to be relatively simple and advantageously tends to speed up the problem-solving process. This tends to be because each sub-problem may be solved independently and the solutions to the sub-problems may then be concatenated to obtain a solution to the larger problem. For example, the first input parameters 10 may only affect a first of the third outputs 28, whilst the second input parameters 18 may only affect a second of the third outputs 28.

However, in other embodiments, the larger problem may not be fully decomposable in this way. Solving the sub-problems independently and concatenating the results tends to yield poor solutions to the larger problem. Preferably, if the larger problem is not fully decomposable, problem decomposition methods in which independent optimisation of sub-problems is combined with communication and monitoring processes. These communication and monitoring processes may operate so as to convey information between the processes that are optimising the sub-problems and continually monitor and steer them on the basis of the current 'global' solution to the larger problem.

Any appropriate problem decomposition process may be used. For example, a problem decomposition process that is closely tied to a particular optimisation process may be used. For example, "Benders' decomposition", and variants thereof, may be used. Further information regarding "Benders' decomposition" may be found in, which is incorporated herein by reference. Such approaches tend to be particularly useful when problems can be expressed as mathematical programming problems. Also, such approaches advantageously tend to exploit a particular way of grouping the variables and stages of optimisation within the linear or stochastic programming formulation. Further examples of problem decomposition process include so-called "divide and conquer" approaches (e.g. as described in more detail in or example, in[8] which is incorporated herein by reference), and so called "cooperative coevolution" approaches in which problems may be randomly partitioned into sub-problems that were solved independently, but where the quality of a sub-problem's solution may be calculated dynamically (e.g. as described in more detail in or example, in[9,10] which is incorporated herein by reference).

Further information about "cooperative coevolution" approaches may be found in which is incorporated herein by reference. Essentially, cooperative coevolution approaches comprise partitioning the larger problem into a group of smaller sub-problems. Optimisation may then progress by combining independent optimisation of these sub-problems with intermittent communication of information between them. A partition into sub-problems may be thought of as a partition into groups of parameters. While an individual sub-problem is being optimized, the quality of the current solution to that sub-problem may continually be estimated. The values for the parameters that are not involved in that sub-problem may be fixed. Thus, each independent optimisation of a sub-problem comprises assuming that the current solutions to the other sub-problems are fixed. Communication between sub-problems may take the form of occasionally updating and resetting each sub-problem's view of the other sub-problems' latest parameter settings. Hence, at intervals, each sub-problem may receive a "global steering signal". This approach tends to significantly improve performance on large-scale problems. For example, the results be achieved in a substantially shorter time and/or the results may be of better quality when compared to a conventional global optimisation approach.

A co-evolution approach to problem decomposition comprises the partitioning of the larger problem into sub-problems. The structure inherent within SysML™ representations of the systems engineering model 100 tends to facilitate in the partitioning of the larger problem into sub-problems. For example, the SysML™ representations of the systems engineering model 100 tends to facilitate a human designer to easily view and explore the designs that represent the trade-off between competing system requirements. The visualisation of the problem provided by SysML™ tends to facilitate a human designer in identifying appropriate input groups for optimisation. For example, using the SysML™ representation a human designer may (in a relatively easy way) interrogate or investigate the functions that express system or subsystem requirements to identify a group of inputs that has a relatively great effect on a particular systems engineering model output. These inputs may then be specified as an input group by the human designer. Also, input groups may be by the human designer based upon the human designer's knowledge or experience.

The performance of steps s12 and s14 may produce, for each input group, a plurality of sets of input values. Each of these sets of input values comprises an input value for each of the inputs to the systems engineering model 100. Also, each of these sets of inputs values tends to correspond to different values of the outputs of the systems engineering model 100 (i.e. the third outputs 28). Each of these sets of inputs values may be thought of as specifying a different design for the vehicle 2 with optimised attributes.

In this embodiment, the optimisation process used may be that described in Q. Zhang et al., "*The Performance of a New Version of MOEA/D on CEC09 Unconstrained MOP Test Instances*", IEEE Congress on Evolutionary Computation, pp. 203-208, 2009 (CEC), which is incorporated herein by reference. However, in other embodiments a different optimisation process may be used.

Thus, the performance of steps s12 and s14 tends to produce a plurality of different vehicle designs.

At step s18, from the plurality of different vehicle designs, a single vehicle design is selected.

The selection of a single design from the plurality of different vehicle designs may be performed in any appropriate way. In this embodiment, each of the plurality of different vehicle designs may have a different trade-off between the weight of the vehicle, $w_v$, and the maximum speed of the vehicle, $v_v$. In this embodiment, from the plurality of different vehicle designs, a "Pareto optimal set" of designs is determined (e.g. by one or more processors). Each vehicle design in the Pareto optimal set is a design that has a Pareto optimal (or Pareto efficient) trade-off between vehicle weight, $w_v$, and the vehicle maximum speed, $v_v$. From this Pareto optimal set of vehicle designs, a single vehicle design is then selected.

Figure 6:
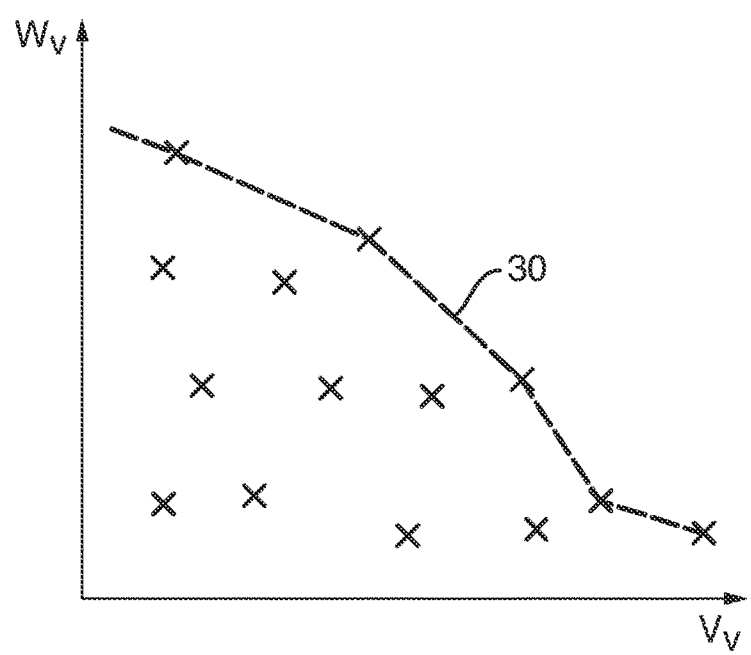
FIG. 6 is a schematic illustration (not to scale) of a graph showing design tradeoffs.

FIG. 6 is a schematic illustration (not to scale) of a graph showing tradeoffs between the vehicle weight, $w_v$, and the vehicle maximum speed, $v_v$ of each of the plurality of different vehicle designs determined at step s14. The trade-off of each of the designs is indicated in FIG. 5 by an 'x'. The dotted line in FIG. 5 (indicated by the reference numeral 30) represents the Pareto optimal set of vehicle designs. In other words, the vehicle designs x that lie along the dotted line 30 are members of the Pareto optimal set, whereas vehicle designs x that do not lie along the dotted line 30 are not members of the Pareto optimal set.

At step s20, a vehicle 2 is constructed in accordance with the single vehicle design selected at step s18. In other words, a vehicle 2 is constructed such that the chassis 4 and the battery 6 of that vehicle 2 have attributes/parameters as specified in the inputs to the relevant systems engineering model 100 (i.e. the systems engineering model 100 that corresponds to the design in accordance with which the vehicle is constructed).

Thus, a process of designing and producing the vehicle 2 is provided.

The above described method and apparatus for performing this method advantageously tend to exploit multi-objective optimisation algorithms to aid a human designer in the understanding of trade-offs in the design of a large scale and complex system. The application of multi-objective optimisation algorithms advantageously tends to generate a set of designs that represent a trade-off between competing system requirements.

The above described method and apparatus for performing this method advantageously tend to produce a set of solutions that represent the best available trade-off amongst the performance objectives (i.e. the Pareto optimal designs).

Conventionally, the design/engineering of a complex system may be decomposed into a set of sub-problems, which may then be developed, in relative isolation, e.g. by a set of specialised teams. Each team may model the trade-offs between some or all of derived subsystem requirements. Understanding the trade-off between competing requirements across the whole system, e.g. by collating and reviewing the individual models or design documentation, tends to be a time consuming and error prone process. The above described method and apparatus advantageously tend to solve or alleviate this problem.

SysML™ is a general purpose modelling language. The above described method and apparatus for performing this method advantageously tend to exploit the SysML™ representation of the design problem (by interrogating and investigating the structure within the system design to determine input groups) to efficiently generate a set of design solutions. The structure inherent in a SysML™ design tends to provide significant benefits in terms of the time to generate a set of solutions that represent the trade-offs.

Use of the SysML™ language means that the multi-objective optimisation can be performed in other ways than a completely blind black-box optimisation. The SysML™ language advantageously tends to enable a systems engineer to view and explore (e.g. in a relatively intuitive way, e.g. using a computer) the designs that represent the trade-off between competing system requirements. In other words, the structure inherent in the SysML™ representation advantageously tends to provide insight into how the design problem is structured and therefore could enable the multi-objective optimisation algorithm to be adapted (e.g. by a human designer, or automatically by one or more processors) to exploit these properties.

The above described method tends to provide better system designs than using conventional methods. Furthermore, these new designs tend to be produced faster than when using conventional processes.

Using the above described method and apparatus to design a system tends to produce different system designs than would otherwise be produced (i.e. using conventional methods). Thus, systems produced in accordance with the system designs produced using the above described method and apparatus tend to be different to those produce using conventional methodologies.

In the above embodiments, the system built using the above described methods and apparatus is a land-based autonomous vehicle. However, in other embodiments, the above described method and apparatus is used to design and/or build a different system, for example, a different type of vehicle e.g. an aircraft.

In the above embodiment, the vehicle comprises two subsystems, namely the chassis and the battery. However, in other embodiments, the system comprises one or more different systems instead of or in addition to those two subsystems, e.g. software systems or components. Thus, in other embodiments, parametric models for each of those additional or replacement subsystems may be determined and used to construct the systems engineering model. Thus, in other embodiments, a different systems engineering model is determined.

In the above embodiments, system requirements that are to be fulfilled by the vehicle are that the vehicle 2 weighs less than or equal to 2 kg, and that the maximum speed of the vehicle 2 is at least 3 kmph. However, in other embodiments, there are one or more different criteria instead of or in addition to either or both of those system requirements.

In the above embodiments, the selection of a single design from the plurality of different vehicle designs is performed by determining the Pareto optimal set of designs (with respect to the trade-off between the weight of the vehicle and the maximum speed of the vehicle), and selecting a design from that Pareto optimal set. However, in other embodiments, the selection of a single design from the plurality of different vehicle designs is performed in a different way.

In the above embodiments, the parametric models and systems engineering model is represented using the SysML™ representation. However, in other embodiments, one or more of the parametric models and/or systems engineering model is represented using a different representation or modelling language that provides the same functionality as that described above for the SysML™ representation.

The invention claimed is:

1. A method of producing a design for a vehicle comprising a system, the system comprising a plurality of subsystems, the method comprising:
    identifying one or more criteria that are to be satisfied by the system;
    for each subsystem, using the one or more identified criteria, determining one or more further criteria that are to be satisfied by that subsystem;
    for each subsystem, using the one or more further criteria determined for that subsystem, determining a parametric model for that subsystem, the parametric model for that subsystem comprising one or more parametric model inputs and one or more parametric model outputs, each of the parametric model inputs relating to an attribute of that subsystem, each of the parametric model outputs being dependent upon one or more of the parametric model inputs for that parametric model, each of the parametric model outputs relating to one or more of the further criteria determined for that subsystem, each parametric model including at least one connection to a parametric model of a different subsystem, the at least one connection representing a relative relationship between one or more requirements of each of the parametric models that are connected to each other;
    using the determined parametric models, determining a systems engineering model for the system, the systems engineering model comprising each of the subsystems, one or more system model inputs, and one or more system model outputs, each system model input being a parametric model input for one or more of the determined parametric models, each of the system model outputs being dependent upon one or more of the system model inputs, each of the system model outputs relating to one or more of the identified criteria;
    forming one or more groups of system model inputs, each group including a number of system model inputs that is less than the total number of system model inputs;
    performing, for each group of system model inputs, using the systems engineering model, by one or more processors, an optimisation process to determine a set of system model inputs that correspond to the identified criteria being satisfied, the optimisation process for a group of system model inputs comprising:
        fixing or constraining the values of the system model inputs that are not in that group; and
        determining values for the system model inputs within that group such that the criteria are satisfied while the system model inputs that are not in the group are fixed or constrained;
    selecting one of the one or more sets of system model inputs that correspond to the identified criteria being satisfied, whereby to provide a design for the system; and
    constructing the vehicle in accordance with the produced design,
    wherein the design allows for constructing the vehicle in accordance with the design for the system, such that a first subsystem of the vehicle and a second subsystem of the vehicle have the attribute of each respective subsystem used by the parametric model for that subsystem.

2. The method according to claim 1, wherein forming one or more groups comprises:
    providing a representation of the systems engineering model using a general-purpose modelling language; and
    displaying, on a display operatively coupled to the one or more processors, the representation of the systems engineering model, thereby allowing the displayed representation of the systems engineering model to be analyzed to determine the one or more groups, and further allowing the determined groups to be specified to the one or more processors.

3. The method according to claim 1, wherein determining a systems engineering model for the system comprises specifying the systems engineering model using a general-purpose modelling language.

4. The method according to claim 1, wherein forming one or more groups comprises receiving input indicative of the one or more groups.

5. The method according to claim 1, wherein forming one or more groups is performed by the one or more processors.

6. The method according to claim 1, wherein optimising comprises performing a cooperative coevolution process.

7. The method according to claim 1, wherein selecting one of the one or more sets of systems model inputs comprises:
    using the determined one or more sets of system model inputs that correspond to the identified criteria being satisfied, determining a Pareto optimal set of sets of system model inputs that correspond to the identified criteria being satisfied; and
    selecting a member of the Pareto optimal set, whereby to provide a design for the system.

8. The method according to claim 1, wherein the system is a vehicle.

9. The method according to claim 1, wherein forming one or more groups comprises:
    providing a representation of the systems engineering model using a general-purpose modelling language;
    displaying to a human operator, on a display operatively coupled to the one or more processors, the representation of the systems engineering model;
    analysing, by the human operator, the displayed representation of the systems engineering model to determine the one or more groups; and
    specifying, by the human operator to the one or more processors, the determined groups.

10. Apparatus for producing a design for a vehicle comprising a system, the system comprising a plurality of subsystems, the apparatus comprising one or more processors of a computing system configured to perform a process including:
    identifying one or more criteria that are to be satisfied by the system;
    for each subsystem, using the one or more identified criteria, determining one or more further criteria that are to be satisfied by that subsystem;
    for each subsystem, using the one or more further criteria determined for that subsystem, for determining a parametric model for that subsystem, the parametric model for that subsystem comprising one or more parametric model inputs and one or more parametric model outputs, each of the parametric model inputs relating to an attribute of that subsystem, each of the parametric model outputs being dependent upon one or more of the parametric model inputs for that parametric model, each of the parametric model outputs relating to one or more of the further criteria determined for that subsystem, each parametric model including at least one connection to a parametric model of a different subsystem, the at least one connection representing a relative relationship between one or more requirements of each of the parametric models that are connected to each other;

using the determined parametric models, determining a systems engineering model for the system, the systems engineering model for the system comprising each of the subsystems, one or more system model inputs, and one or more system model outputs, each system model input being a parametric model input for one or more of the determined parametric models, each of the system model outputs being dependent upon one or more of the system model inputs, each of the system model outputs relating to one or more of the identified criteria;

forming one or more groups of system model inputs, each group consisting of a number of system model inputs that is less than the total number of system model inputs;

for each group of system model inputs and using the systems engineering model, performing an optimisation process to determine a set of system model inputs that correspond to the identified criteria being satisfied, the optimisation process for a group of system model inputs comprising:
  fixing or constraining the values of the system model inputs that are not in that group; and
  determining values for the systems model inputs within that group such that the criteria are satisfied while the system model inputs that are not in the group are fixed or constrained;

selecting one of the one or more sets of system model inputs that correspond to the identified criteria being satisfied, whereby to provide a design for the system; and constructing the vehicle in accordance with the produced design, wherein the design allows for constructing the vehicle in accordance with the design for the system, such that a first subsystem of the vehicle and a second subsystem of the vehicle have the attribute of each respective subsystem used by the parametric model for that subsystem.

11. The apparatus according to claim 10, wherein forming one or more groups comprises:
  providing, by the one or more processors, a representation of the systems engineering model using a general-purpose modelling language; and
  a display operatively coupled to the one or more processors and configured to display the representation of the systems engineering model to allow the displayed representation of the systems engineering model to be analyzed to determine the one or more groups; and
  a user input operatively coupled to the one or more processors and configured to input to the one or more processors a specification of the determined groups.

12. The apparatus according to claim 10, wherein selecting one of the one or more sets of systems model inputs comprises:
  one or more processors configured, using the determined one or more sets of systems model inputs that correspond to the identified criteria being satisfied, to determine a Pareto optimal set of sets of system model inputs that correspond to the identified criteria being satisfied; and
  selecting a member of the Pareto optimal set, whereby to provide a design for the system.

13. The apparatus according to claim 10, wherein:
forming one or more groups comprises:
  one or more processors configured to provide a representation of the systems engineering model using a general-purpose modelling language; and
  a display operatively coupled to the one or more processors and configured to display the representation of the systems engineering model to allow the displayed representation of the systems engineering model to be analyzed to determine the one or more groups; and
  a user input operatively coupled to the one or more processors and configured to input to the one or more processors a specification of the determined groups; and
selecting one of the one or more sets of systems model inputs comprises:
  one or more processors configured, using the determined one or more sets of systems model inputs that correspond to the identified criteria being satisfied, to determine a Pareto optimal set of sets of system model inputs that correspond to the identified criteria being satisfied, such that a member of the Pareto optimal set can be selected so as, to provide a design for the system.

14. The apparatus according to claim 10, further comprising instructions stored on one or more non-transitory processor readable mediums accessible by the one or more processors.

15. A non-transitory machine readable storage medium storing instructions that when executed by one or more processors of a computing system cause a process to be carried out, the process for producing a design for a vehicle comprising a system that includes a plurality of subsystems, the process comprising:
  identifying one or more criteria that are to be satisfied by the system;
  for each subsystem, using the one or more identified criteria, determining one or more further criteria that are to be satisfied by that subsystem;
  for each subsystem, using the one or more further criteria determined for that subsystem, determining a parametric model for that subsystem, the parametric model for that subsystem comprising one or more parametric model inputs and one or more parametric model outputs, each of the parametric model inputs relating to an attribute of that subsystem, each of the parametric model outputs being dependent upon one or more of the parametric model inputs for that parametric model, each of the parametric model outputs relating to one or more of the further criteria determined for that subsystem, each parametric model including at least one connection to a parametric model of a different subsystem, the at least one connection representing a relative relationship between one or more requirements of each of the parametric models that are connected to each other;

using the determined parametric models, determining a systems engineering model for the system, the systems engineering model comprising each of the subsystems, one or more system model inputs, and one or more system model outputs, each system model input being a parametric model input for one or more of the determined parametric models, each of the system model outputs being dependent upon one or more of the system model inputs, each of the system model outputs relating to one or more of the identified criteria;

forming one or more groups of system model inputs, each group including a number of system model inputs that is less than the total number of system model inputs;

performing, for each group of system model inputs, using the systems engineering model, by one or more processors, an optimisation process to determine a set of system model inputs that correspond to the identified criteria being satisfied, the optimisation process for a group of system model inputs comprising:
    fixing or constraining the values of the system model inputs that are not in that group; and
    determining values for the system model inputs within that group such that the criteria are satisfied while the system model inputs that are not in the group are fixed or constrained;

selecting one of the one or more sets of system model inputs that correspond to the identified criteria being satisfied, whereby to provide a design for the system; and constructing the vehicle in accordance with the produced design, wherein the design allows for constructing the vehicle in accordance with the design for the system, such that a first subsystem of the vehicle and a second subsystem of the vehicle have the attribute of each respective subsystem used by the parametric model for that subsystem.

* * * * *